(12) United States Patent
Lien et al.

(10) Patent No.: US 10,236,913 B2
(45) Date of Patent: Mar. 19, 2019

(54) ERROR CHECKING AND CORRECTING DECODER

(71) Applicant: Winbond Electronics Corp., Taichung (TW)

(72) Inventors: Chuen-Der Lien, San Jose, CA (US); Ngatik Cheung, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/592,220

(22) Filed: May 11, 2017

(65) Prior Publication Data

US 2018/0331700 A1    Nov. 15, 2018

(51) Int. Cl.
  *H03M 13/15*  (2006.01)
  *H03M 13/07*  (2006.01)
  *H03M 13/00*  (2006.01)

(52) U.S. Cl.
  CPC ......... *H03M 13/152* (2013.01); *H03M 13/07* (2013.01); *H03M 13/157* (2013.01); *H03M 13/617* (2013.01)

(58) Field of Classification Search
  CPC .................................................. H03M 13/151
  USPC ....................................................... 714/782
  See application file for complete search history.

(56) References Cited

U.S. PATENT DOCUMENTS

| | | | | |
|---|---|---|---|---|
| 5,440,570 A | * | 8/1995 | Wei | H03M 13/152 714/756 |
| 6,738,942 B1 | * | 5/2004 | Sridharan | H03M 13/152 714/755 |
| 6,745,363 B2 | | 6/2004 | Poirier et al. | |
| 8,683,293 B2 | | 3/2014 | Saxena et al. | |
| 2011/0145677 A1 | | 6/2011 | Saxena et al. | |
| 2014/0281822 A1 | | 9/2014 | Wu et al. | |
| 2017/0093433 A1 | * | 3/2017 | Ilani | H03M 13/153 |

FOREIGN PATENT DOCUMENTS

TW         183832       5/1992

OTHER PUBLICATIONS

"Office Action of Taiwan Counterpart Application", dated Oct. 2, 2018, p. 1-p. 5.

* cited by examiner

*Primary Examiner* — Fritz Alphonse
(74) *Attorney, Agent, or Firm* — JCIPRNET (57) ABSTRACT

An error checking and correcting (ECC) decoder is provided to perform a BCH decoding to decode codeword into decoded data. The ECC decoder includes a syndrome generator circuit, an error locator polynomial circuit, and a decoding circuit. The syndrome generator circuit generates a plurality of syndromes corresponding to the codeword. The error locator polynomial circuit performs an arithmetic operation by using the syndromes to generate a plurality of coefficients in an error locator polynomial. The arithmetic operation includes a plurality of operators, wherein at least one of the operators is a lookup table circuit. The decoding circuit obtains at least one solution to the error locator polynomial with the coefficients and corrects the codeword according to the solution to the error locator polynomial to generate the decoded data.

20 Claims, 5 Drawing Sheets

ERROR CHECKING AND CORRECTING DECODER

BACKGROUND OF THE INVENTION

Field of the Invention

The invention relates to a decoding circuit, and in particular, an error checking and correcting (ECC) decoder.

Description of Related Art

In the process of data transmission and/or data storage, data reliability is an important issue. For example, with characteristics including data non-volatility, energy saving, small size, etc., the non-volatile memory is applicable to various electronic devices. Generally, data to be written to the non-volatile memory are encoded through an ECC encoder (ECC encoding circuit) to generate a corresponding ECC code. Then, a codeword including the data and the ECC code is stored in the non-volatile memory. Conversely, an ECC decoder obtains the codeword (encoded data) from the non-volatile memory and then performs an ECC decoding procedure to decode the codeword into decoded data. In other words, the ECC decoder can correct error bits in the read data by using the corresponding ECC code.

The ECC decoding procedure applied to the non-volatile memory (e.g., a flash memory) is, for example, a Bose-Chaudhuri-Hocquenghem (BCH) decoding procedure. However, as the memory capacity increases, the time taken for performing a BCH decoding also increases. Accordingly, how to reduce the time taken for the BCH decoding (enhancing a decoding efficiency) and how to lower power consumption of the BCH decoding are issues that concern people skilled in the art.

SUMMARY OF THE INVENTION

The invention provides an error checking and correcting decoder for performing a Bose-Chaudhuri-Hocquenghem decoding.

An embodiment of the invention provides an ECC decoder for performing a BCH decoding method to decode codeword into decoded data. The ECC decoder includes a syndrome generator circuit, an error locator polynomial circuit, and a decoding circuit. The syndrome generator circuit receives the codeword. The syndrome generator circuit generates a plurality of syndromes corresponding to the codeword. At least one input end of the error locator polynomial circuit is coupled to at least one output end of the syndrome generator circuit to receive the syndromes. The error locator polynomial circuit performs an arithmetic operation by using the syndromes to generate a plurality of coefficients of an error locator polynomial. The arithmetic operation includes a plurality of operators, wherein at least one operator in the operators is a lookup table (LUT) circuit. The decoding circuit is coupled to at least one output end of the error locator polynomial circuit to receive the coefficients. The decoding circuit corrects the codeword to generate the decoded data according to at least one solution to the error locator polynomial with the coefficients.

In light of the above, the ECC decoder described in the embodiments of the invention is capable of performing the BCH decoding. In the process of the BCH decoding, the LUT circuit is used to implement part of the operators to enhance a speed and lower power consumption.

DESCRIPTION OF THE EMBODIMENTS

Figure 1:
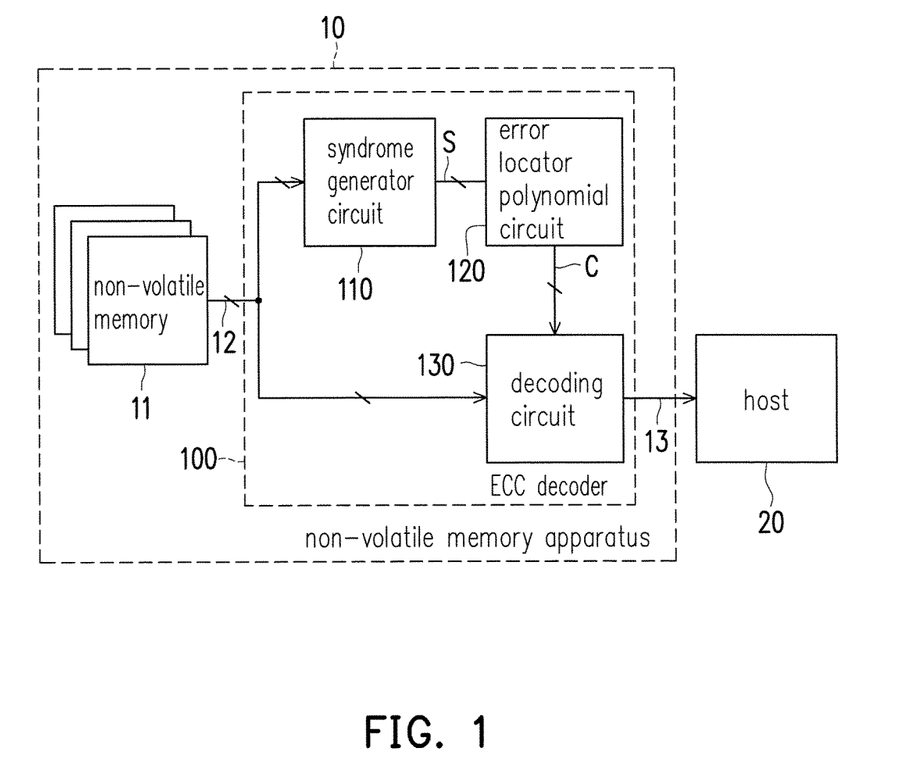
FIG. 1 is a schematic circuit block diagram illustrating an error checking and correcting decoder according to an embodiment of the invention.

In the embodiment illustrated in FIG. 1, the ECC decoder 100 is applied to a non-volatile memory apparatus 10. The non-volatile memory apparatus 10 is a flash drive, a memory card, a solid state drive (SSD), an embedded MMC (eMMC), or another storage apparatus. In other embodiments, the ECC decoder 100 is also applied to a communication apparatus or another apparatus/system.

Referring to FIG. 1, the non-volatile memory apparatus 10 includes a non-volatile memory 11 and the ECC decoder 100. The non-volatile memory 11 outputs codeword 12 to the input terminal of the ECC decoder 100. The ECC decoder 100 performs a BCH decoding method. Accordingly, the ECC decoder 100 decodes the codeword 12 into decoded data 13 and then provides the decoded data 13 to a host 20.

In the embodiment illustrated in FIG. 1, the ECC decoder 100 includes a syndrome generator circuit 110, an error locator polynomial circuit 120, and a decoding circuit 130. The syndrome generator circuit 110 receives the codeword 12 from the non-volatile memory 11. Through the BCH decoding method, the syndrome generator circuit 110 generates a plurality of syndromes S corresponding to the codeword 12. According to the design needs, the syndrome generator circuit 110 may adopt any one algorithm to calculate the syndromes S corresponding to the codeword 12. For example, the syndrome generator circuit 110 may adopt a conventional algorithm or another algorithm to calculate the syndromes S, which is thus not repeatedly described here.

Supposing that the codeword 12 includes N bits and the ECC decoder 100 at most corrects m error bits in the codeword 12, wherein N and m are integers and N is greater than m. The N and m may be determined by the design needs. For example, the codeword 12 includes 64 bits (N=64) and the ECC decoder 100 at most corrects 3 error bits (m=3) in the codeword 12. In an applied situation where m is 3, the syndrome generator circuit 110 calculates 3 syndromes S, for example, a syndrome S1, a syndrome S3, and a syndrome S5. Analogously, in an applied situation where m is 5, the syndrome generator circuit 110 calculates 5 syndromes S.

An input end of the error locator polynomial circuit 120 is coupled to an output end of the syndrome generator circuit 110 to receive the syndromes S. The error locator polynomial circuit 120 performs an arithmetic operation by using the syndromes S to generate a plurality of coefficients C in an error locator polynomial. The arithmetic operation includes a plurality of operators, wherein at least one of the operators is a lookup table (LUT) circuit. The LUT circuit includes a read only memory (ROM) or another memory for storing a lookup table.

In some embodiments, the error locator polynomial is $$\sum_{i=0}^{m} a_i X^i = 0,$$

wherein the coefficient C is a coefficient $a_i$. In an applied situation where m is 3, the error locator polynomial circuit 120 performs an arithmetic operation by using the syndrome S1, the syndrome S3, and the syndrome S5 to generate a third-degree term coefficient $a_3$, a second-degree term coefficient $a_2$, a first-degree term coefficient $a_1$, and a constant term coefficient $a_0$ in an error locator polynomial $a_3 X^3 + a_2 X^2 + a_1 X + a_0 = 0$.

In other embodiments, the error locator polynomial is $$X^m + S1 X^{m-1} \sum_{i=0}^{m-2} b_i X^i = 0,$$

wherein the coefficient C is a coefficient $b_i$. In an applied situation where m is 3, the error locator polynomial circuit 120 performs an arithmetic operation by using the syndrome S1, the syndrome S3, and the syndrome S5 to generate a first-degree term coefficient $b_1$ and a constant term coefficient $b_0$ in an error locator polynomial $X^3 + S1\ X^2 + b_1 X + b_0 = 0$.

The decoding circuit 130 is coupled to an output end of the error locator polynomial circuit 120 to receive the coefficients C. Through the BCH decoding method, the decoding circuit 130 obtains at least one solution (or at least one root) to the error locator polynomial with the coefficients C, and corrects the codeword 12 according to the solution (root) to the error locator polynomial to generate the decoded data 13. According to the design needs, the decoding circuit 130 may adopt any one algorithm to obtain the solution (root) to the error locator polynomial. For example, the decoding circuit 130 may adopt a conventional algorithm or another algorithm to calculate the solution (root) to the error locator polynomial, which is thus not repeatedly described here.

In the applied situation where m is 3, the decoding circuit 130 obtains at least one solution to the error locator polynomial $a_3 X^3 + a_2 X^2 + a_1 X + a_0 = 0$, wherein the solution (root) to X indicates a location of an error bit in the codeword 12. By performing an inverting operation on a bit value in the error bit, the decoding circuit 130 corrects the error bit. Accordingly, the decoding circuit 130 obtains the corrected decoded data 13. For example, supposing that the codeword 12 is a 4-bit value "1111" and supposing that the solution to X is "0001" (which means that a first bit in the codeword 12 is the error bit). Accordingly, the decoding circuit 130 performs an inverting operation on the first bit of the codeword 12 and thereby generates "1110" as the decoded data 13.

Figure 2:
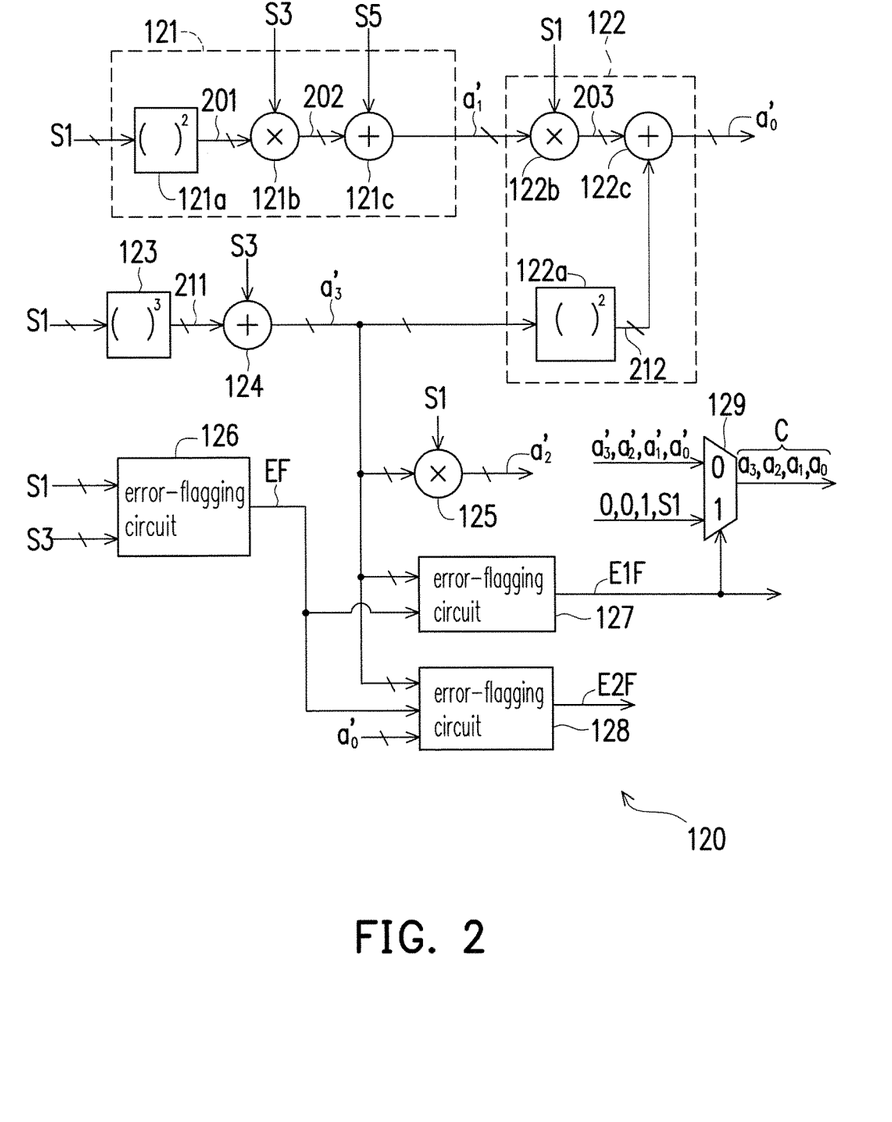
FIG. 2 is a schematic circuit block diagram illustrating an error locator polynomial circuit shown in FIG. 1 according to an embodiment of the invention.

In the embodiment illustrated in FIG. 2, it is supposed that the ECC decoder 100 at most corrects 3 error bits (m=3) in the codeword 12. In the applied situation where in is 3, the 3 syndromes S output by the syndrome generator circuit 110 to the error locator polynomial circuit 120 include the syndrome S1, the syndrome S3, and the syndrome S5. Bit numbers of the syndrome S1, the syndrome S3, and the syndrome S5 may be determined by the design needs. For example, any one of the syndrome S1, the syndrome S3, and the syndrome S5 is a 6-bit value.

The error locator polynomial circuit 120 includes a first arithmetic circuit 121 and a second arithmetic circuit 122. By using part or all of the syndromes S, the first arithmetic circuit 121 performs a first finite field arithmetic operation to generate a first-degree term value $a_1'$. The second arithmetic circuit 122 is coupled to the first arithmetic circuit 121 to receive the first-degree term value $a_1'$. By using part or all of the syndromes S and by using the first-degree term value $a_1'$, the second arithmetic circuit 122 performs a second finite field arithmetic operation to generate a constant term value $a_0'$. The finite field arithmetic operation is also referred to as a Galois field (GF) arithmetic operation. For example, in an applied situation where "the syndrome S1, the syndrome S3, and the syndrome S5 are all 6-bit syndromes", an order of the finite field arithmetic operation is 64 (i.e., $2^6$, which is generally represented as GF(64)).

In the embodiment illustrated in FIG. 2, the first arithmetic circuit 121 includes a finite field squaring circuit 121a, a finite field multiplying circuit 121b, and a finite field adding circuit 121c. The finite field squaring circuit 121a receives and uses the syndrome S1 in the syndromes S to perform a finite field squaring operation to generate a finite field square value 201 of the syndrome S1, i.e., a finite field arithmetic value of $(S1)^2$. In some embodiments, a 1-stage XOR gate is used to implement the finite field squaring circuit 121a. The finite field multiplying circuit 121b is coupled to the finite field squaring circuit 121a to receive the finite field square value 201. The finite field multiplying circuit 121b uses the finite field square value 201 and the syndrome S3 in the syndromes S to perform a finite field multiplying operation to generate a finite field product value 202, i.e., a finite field arithmetic value of $(S1)^2 * S3$. In some embodiments, a 1-stage AND gate and a 4-stage XOR gate are used to implement the finite field multiplying circuit 121b. The finite field adding circuit 121c is coupled to the finite field multiplying circuit 121b to receive the finite field product value 202. The finite field adding circuit 121c uses the finite field product value 202 and the syndrome S5 in the syndromes S to perform a finite field adding operation to generate the first-degree term value $a_1'$, i.e., a finite field arithmetic value of $(S1)^2 * S3 + S5$. In some embodiments, the 1-stage XOR gate is used to implement the finite field adding circuit 121c.

In the embodiment illustrated in FIG. 2, the error locator polynomial circuit 120 further includes a LUT circuit 123 and a finite field adding circuit 124. The LUT circuit 123 receives and uses the syndrome 51 in the syndromes S to look up a lookup table to obtain a finite field cube value 211 of the syndrome S1, i.e., a finite field arithmetic value of $(S1)^3$. The LUT circuit 123 includes a read only memory or another memory for storing the lookup table. For example, in an applied situation where "the syndrome S1 is a 6-bit value" and "the finite field cube value 211 is a 6-bit value", the LUT circuit 123 includes a storage space of 63*6 bits for storing the lookup table of "converting S1 to $(S1)^3$".

The finite field adding circuit 124 is coupled to the LUT circuit 123 to receive the finite field cube value 211. The finite field adding circuit 124 uses the finite field cube value 211 and the syndrome S3 in the syndromes S to perform a finite field adding operation to generate a third-degree term value $a_3'$, i.e., a finite field arithmetic value of $(S1)^3 + S3$. In some embodiments, the 1-stage XOR gate is used to implement the finite field adding circuit 124.

The second arithmetic circuit 122 is further coupled to the finite field adding circuit 124 to receive the third-degree term value $a_3'$. By using part or all of the syndromes S and by using the first-degree term value $a_1'$ and the third-degree term value $a_3'$, the second arithmetic circuit 122 performs the second finite field arithmetic operation to generate the constant term value $a_0'$. In the embodiment illustrated in FIG. 2, the second arithmetic circuit 122 includes a finite field squaring circuit 122a, a finite field multiplying circuit 122b, and a finite field adding circuit 122c. The finite field squaring circuit 122a is coupled to the finite field adding circuit 124 to receive the third-degree term value $a_3'$. The finite field squaring circuit 122a performs a finite field squaring operation by using the third-degree term value $a_3'$ to generate a finite field square value 212 of the third-degree term value $a_3'$, i.e., a finite field arithmetic value of $(a_3')^2$. In the embodiment illustrated in FIG. 2, the third-degree term value $a_3'$ is $(S1)^3+S3$. In some embodiments, the 1-stage XOR gate is used to implement the finite field squaring circuit 122a.

The finite field multiplying circuit 122b is coupled to the first arithmetic circuit 121 to receive the first-degree term value $a_1'$. The finite field multiplying circuit 122b performs a finite field multiplying operation by using the first-degree term value $a_1'$ and the syndrome S1 to generate a finite field product value 203, i.e., a finite field arithmetic value of $a_1'*S1$. In the embodiment illustrated in FIG. 2, the first-degree term value $a_1'$ is $(S1)^2*S3+S5$. In some embodiments, the 1-stage AND gate and the 4-stage XOR gate are used to implement the finite field multiplying circuit 122b. The finite field adding circuit 122c is coupled to the finite field multiplying circuit 122b and the finite field squaring circuit 122a to respectively receive the finite field product value 203 and the finite field square value 212. The finite field adding circuit 122c performs a finite field adding operation by using the finite field product value 203 and the finite field square value 212 to generate the constant term value $a_0'$, i.e., a finite field arithmetic value of $a_1'*S1+(a_3')^2$. In some embodiments, the 1-stage XOR gate is used to implement the finite field adding circuit 122c.

In the embodiment illustrated in FIG. 2, the error locator polynomial circuit 120 further includes a finite field multiplying circuit 125. The finite field multiplying circuit 125 is coupled to the finite field adding circuit 124 to receive the third-degree term value $a_3'$. The finite field multiplying circuit 125 performs a finite field multiplying operation by using the third-degree term value $a_3'$ and the syndrome S1 to generate a second-degree term value $a_2'$, i.e., a finite field arithmetic value of $a_3'*S1$. In some embodiments, the 1-stage AND gate and the 4-stage XOR gate are used to implement the finite field multiplying circuit 125.

In the embodiment illustrated in FIG. 2, the error locator polynomial circuit 120 further includes an error-flagging circuit 126. The error-flagging circuit 126 receives the syndrome S1 and the syndrome S3 in the syndromes S and checks a plurality of bits of the syndrome S1 and a plurality of bits of the syndrome S3. According to a checking result, the error-flagging circuit 126 correspondingly generates an error-flagging signal EF for the decoding circuit 130. The error-flagging signal EF is used to indicate whether an error bit exists in the codeword 12. For example, when the codeword 12 includes an error bit, the error-flagging signal EF is logic "1". Conversely, when the codeword 12 does not include an error bit, the error-flagging signal EF is logic "0". In some embodiments, determination conditions of the error-flagging circuit 126 are that "all bits of the syndrome S1 are 0" and "all bits of the syndrome S3 are 0". When both of the determination conditions hold (i.e., both are true), the error-flagging circuit 126 sets the error-flagging signal EF as logic "0". Otherwise, the error-flagging signal EF is set as logic "1".

In the embodiment illustrated in FIG. 2, the error locator polynomial circuit 120 further includes an error-flagging circuit 127. The error-flagging circuit 127 is coupled to the error-flagging circuit 126 and the finite field adding circuit 124 to respectively receive the error-flagging signal EF and the third-degree term value $a_3'$. The error-flagging circuit 127 checks the error-flagging signal EF and checks a plurality of bits of the third-degree term value $a_3'$. According to a checking result, the error-flagging circuit 127 correspondingly generates an error bit number flagging signal E1F for the decoding circuit 130. The error bit number flagging signal E1F is used to indicate whether a number of error bits in the codeword 12 is 1. For example, when the codeword 12 includes 1 error bit, the error bit number flagging signal E1F is logic "1". Otherwise, the error bit number flagging signal E1F is logic "0". In some embodiments, determination conditions of the error-flagging circuit 127 are that "the error-flagging signal EF is 1" and "all bits of the third-degree term value $a_3'$ are 0". When both of the determination conditions hold (i.e., both are true), the error-flagging circuit 127 sets the error bit number flagging signal E1F as logic "1". Otherwise, the error bit number flagging signal E1F is set as logic "0".

In the embodiment illustrated in FIG. 2, the error locator polynomial circuit 120 further includes an error-flagging circuit 128. The error-flagging circuit 128 is coupled to the error-flagging circuit 126, the second arithmetic circuit 122, and the finite field adding circuit 124 to respectively receive the error-flagging signal EF, the constant term value $a_0'$, and the third-degree term value $a_3'$. The error-flagging circuit 128 checks the error-flagging signal EF, a plurality of bits of the constant term value $a_0'$, and a plurality of bits of the third-degree term value $a_3'$. According to a checking result, the error-flagging circuit 128 correspondingly generates an error bit number flagging signal E2F for the decoding circuit 130. The error bit number flagging signal E2F is used to indicate whether a number of error bits in the codeword 12 is 2. For example, when the codeword 12 includes 2 error bits, the error bit number flagging signal E2F is logic "1". Otherwise, the error bit number flagging signal E2F is logic "0". In some embodiments, determination conditions of the error-flagging circuit 128 are that "the error-flagging signal EF is 1", "any one bit of the third-degree term value $a_3'$ is not 0", and "all bits of the constant term value $a_0'$ are 0". When the three determination conditions all hold (i.e., all are true), the error-flagging circuit 128 sets the error bit number flagging signal E2F as logic "1". Otherwise, the error bit number flagging signal E2F is set as logic "0".

In the embodiment illustrated in FIG. 2, the error locator polynomial circuit 120 further includes a multiplexer 129. In a first mode (i.e., when the error bit number flagging signal E1F is 0), the multiplexer 129 outputs the third-degree term value $a_3'$, the second-degree term value $a_2'$, the first-degree term value $a_1'$, and the constant term value $a_0'$ to the decoding circuit 130 as the third-degree term coefficient, the second-degree term coefficient, the first-degree term coefficient, and the constant term coefficient in the plurality of coefficients C of the error locator polynomial. For example, supposing that the error locator polynomial is $a_3X^3+a_2X^2+a_1X+a_0=0$. In the first mode, the third-degree term value $a_3'$ is used as the third-degree term coefficient $a_3$, the second-degree term value $a_2'$ is used as the second-degree term coefficient $a_2$, the first-degree term value $a_1'$ is used as the first-degree term coefficient $a_1$, and the constant term value $a_0'$ is used as the constant term coefficient $a_0$.

In a second mode (i.e., when the error bit number flagging signal E1F is 1), the multiplexer 129 outputs "0", "0", "1", and "the syndrome S1" to the decoding circuit 130 as the third-degree term coefficient, the second-degree term coefficient, the first-degree term coefficient, and the constant term coefficient in the plurality of coefficients C of the error locator polynomial. For example, supposing that the error locator polynomial is $a_3X^3+a_2X^2+a_1X+a_0=0$. In the second mode, the error locator polynomial is $X+S1=0$.

Nonetheless, the implementation of the error locator polynomial circuit 120 shown in FIG. 1 shall not be limited to the exemplary embodiment illustrated in FIG. 2. For example, In the embodiment illustrated in FIG. 3, it is supposed that the ECC decoder 100 at most corrects 3 error bits (m=3) in the codeword 12. In the applied situation where m is 3, the 3 syndromes S output by the syndrome generator circuit 110 to the error locator polynomial circuit 120 include the syndrome S1, the syndrome S3, and the syndrome S5. Bit numbers of the syndrome S1, the syndrome S3, and the syndrome S5 may be determined by the design needs. For example, any one of the syndrome S1, the syndrome S3, and the syndrome S5 may be a 6-bit value.

Figure 3:
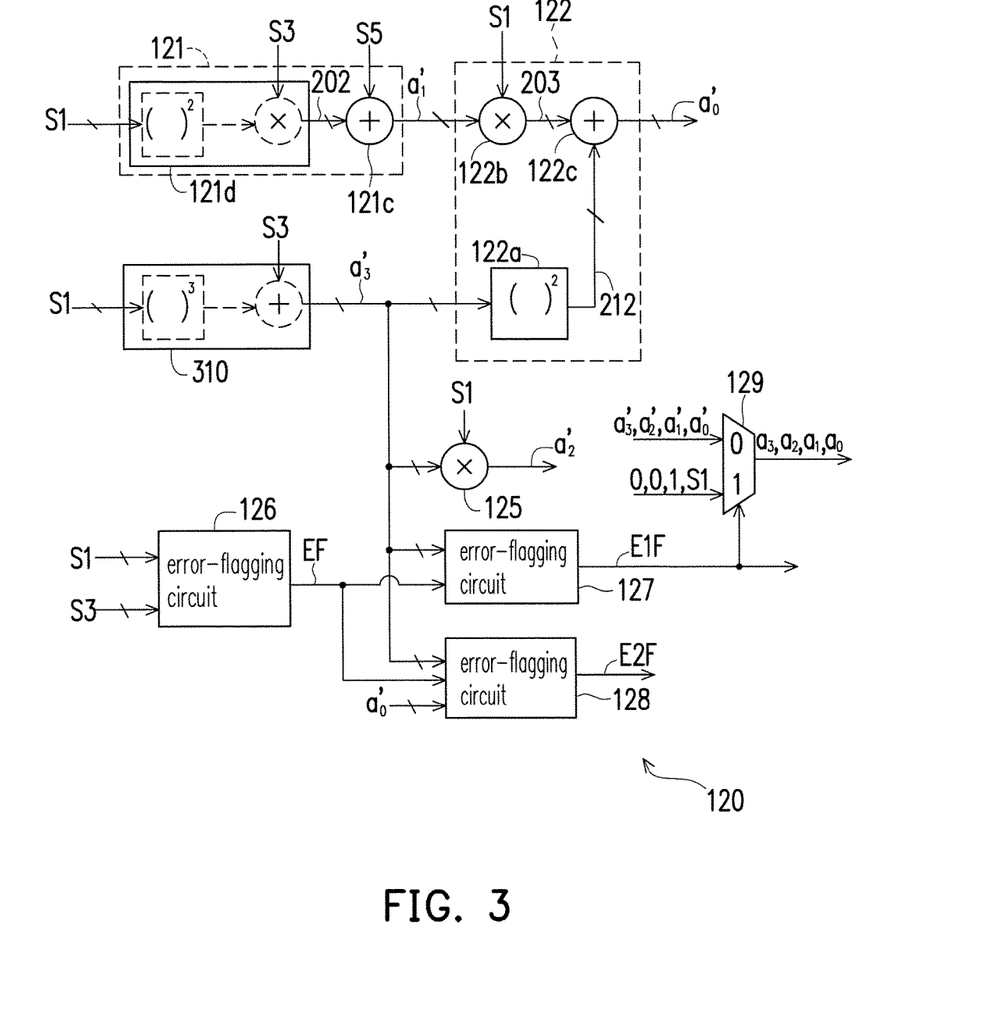
FIG. 3 is a schematic circuit block diagram illustrating the error locator polynomial circuit shown in FIG. 1 according to another embodiment of the invention.

The error locator polynomial circuit 120 includes a first arithmetic circuit 121 and a second arithmetic circuit 122. By using part or all of the syndromes S, the first arithmetic circuit 121 performs a first finite field arithmetic operation to generate a first-degree term value $a_1'$. The second arithmetic circuit 122 is coupled to the first arithmetic circuit 121 to receive the first-degree term value $a_1'$. By using part or all of the syndromes S and by using the first-degree term value $a_1'$, the second arithmetic circuit 122 performs a second finite field arithmetic operation to generate a constant term value $a_0'$.

In the embodiment illustrated in FIG. 3, the first arithmetic circuit 121 includes a LUT circuit 121d and a finite field adding circuit 121c. The LUT circuit 121d receives and uses the syndrome S1 and the syndrome S3 in the syndromes S to look up a lookup table to obtain a finite field product value 202 of the syndrome S3 and a finite field square value of the syndrome S1, i.e., the finite field product value 202 is a finite field arithmetic value of $(S1)^2*S3$. The LUT circuit 121d includes a read only memory or another memory for storing the lookup table. For example, in an applied situation where "the syndrome S1 is a 6-bit value" and "the syndrome S3 is a 6-bit value", the LUT circuit 121d includes a storage space of 63*64*6 bits for storing the lookup table of "converting S1 and S3 to $(S1)^2*S3$". The finite field adding circuit 121c is coupled to the LUT circuit 121d to receive the finite field product value 202. The finite field adding circuit 121c performs a finite field adding operation by using the finite field product value 202 and the syndrome S5 in the syndromes S to generate a first-degree term value $a_1'$, i.e., a finite field arithmetic value of $(S1)^2*S3+S5$.

In the embodiment illustrated in FIG. 3, the error locator polynomial circuit 120 further includes a LUT circuit 310. The LUT circuit 310 receives and uses the syndrome S1 and the syndrome S3 in the syndromes S to look up a lookup table to obtain a finite field adding value of the syndrome S3 and a finite field cube value of the syndrome S1, i.e., the finite field adding value is a finite field arithmetic value of $(S1)^3+S3$. The finite field adding value (i.e., $(S1)^3+S3$) is used as a third-degree term value $a_3'$. The LUT circuit 310 includes a read only memory or another memory for storing the lookup table. For example, in the applied situation where "the syndrome S1 is a 6-bit value" and "the syndrome S3 is a 6-bit value", the LUT circuit 310 includes a storage space of 63*64*6 bits for storing the lookup table of "converting S1 and S3 to $(S1)^3+S3$".

In the embodiment illustrated in FIG. 3, the second arithmetic circuit 122 is further coupled to the LUT circuit 310 to receive the third-degree term value $a_3'$. By using part or all of the syndromes S and by using the first-degree term value $a_1'$ and the third-degree term value $a_3'$, the second arithmetic circuit 122 performs the second finite field arithmetic operation to generate a constant term value $a_0'$. Reference may be made to the second arithmetic circuit 122 illustrated in FIG. 2 for relevant descriptions of the second arithmetic circuit 122 illustrated in FIG. 3, which is thus not repeatedly described here.

In the embodiment illustrated in FIG. 3, the error locator polynomial circuit 120 further includes a finite field multiplying circuit 125, an error-flagging circuit 126, an error-flagging circuit 127, an error-flagging circuit 128, and a multiplexer 129. Reference may be made to FIG. 2 for relevant descriptions of the finite field multiplying circuit 125, the error-flagging circuit 126, the error-flagging circuit 127, the error-flagging circuit 128, and the multiplexer 129 illustrated in FIG. 3, which are thus not repeatedly described here.

In other embodiments, the third-degree term coefficient in the error locator polynomial is set as 1, and the second-degree term coefficient in the error locator polynomial is set as the syndrome 51 in the syndromes S. For example, in an applied situation where "the ECC decoder 100 at most corrects 3 error bits (m is 3) in the codeword 12", the error locator polynomial $a_3X^3+a_2X^2+a_1X+a_0=X^3+(a_2/a_3)X^2+(a_1/a_3)X+(a_0/a_3)=X^3+S1\ X^2+b_1X+b_0=0$, wherein $b_1=(S1)^2+d$, $b_0=S1\ *d+S3$, and $d=[(S1)^5+S5]*[(S1)^3+S3]^{-1}$. Accordingly, the error locator polynomial circuit 120 outputs the syndrome S1, the first-degree term coefficient $b_1$, and the constant term coefficient $b_0$ to the decoding circuit 130 as the coefficients C.

Figure 4:
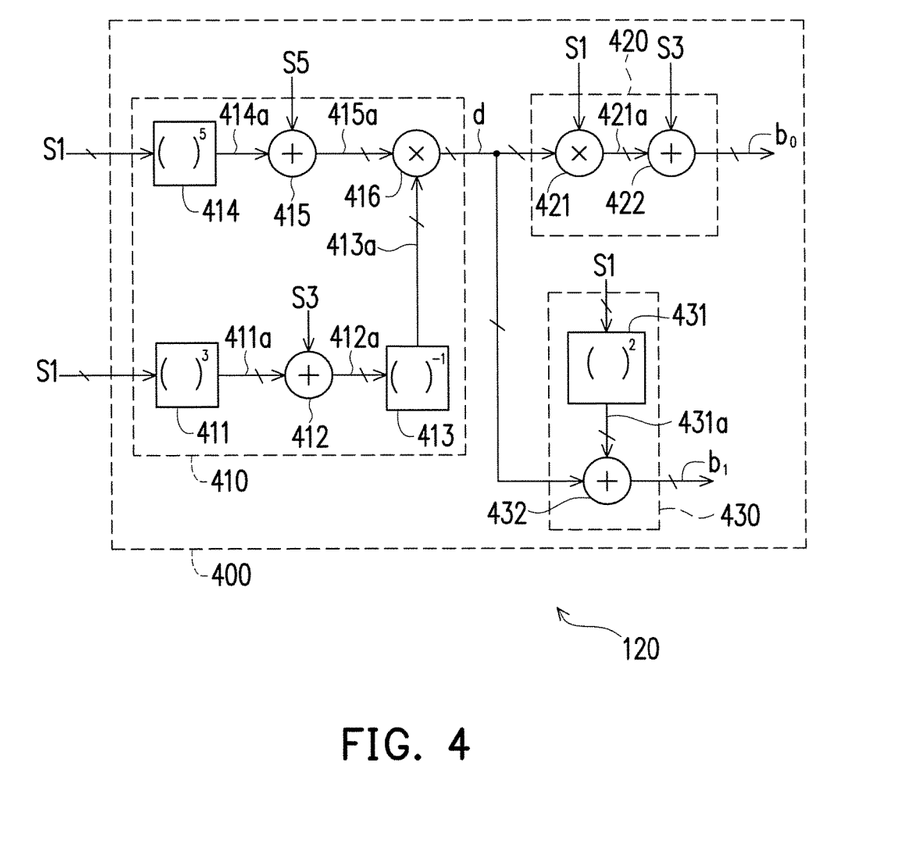
FIG. 4 is a schematic circuit block diagram illustrating the error locator polynomial circuit shown in FIG. 1 according to another embodiment of the invention.

In the embodiment illustrated in FIG. 4, it is supposed that the ECC decoder 100 at most corrects 3 error bits (m=3) in the codeword 12. In the applied situation where m is 3, the 3 syndromes S output by the syndrome generator circuit 110 to the error locator polynomial circuit 120 include the syndrome S1, the syndrome S3, and the syndrome S5. Bit numbers of the syndrome S1, the syndrome S3, and the syndrome S5 may be determined by the design needs. For example, any one of the syndrome S1, the syndrome S3, and the syndrome S5 may be a 6-bit value. The error locator polynomial circuit 120 performs an arithmetic operation by using the syndrome S1, the syndrome S3, and the syndrome S5 to generate a first-degree term coefficient $b_1$ and a constant term coefficient $b_0$ in an error locator polynomial $X^3+S1\ X^2+b_1X+b_0=0$ for decoding circuit 130.

The decoding circuit 130 is coupled to an output end of the error locator polynomial circuit 120 to receive the syndrome 51, the first-degree term coefficient $b_1$, and the constant term coefficient $b_0$ as the coefficients C. Through the BCH decoding method, in the applied situation where m is 3, the decoding circuit 130 obtains at least one solution to the error locator polynomial $X^3+S1\ X^2+b_1X+b_0=0$, wherein the solution (root) to X indicates a location of an error bit in the codeword 12. By performing an inverting operation on a bit value in the error bit, the decoding circuit 130 corrects the error bit. According to the design needs, the decoding circuit 130 may adopt any one algorithm to obtain the solution (root) to the error locator polynomial. For example, the decoding circuit 130 may adopt a conventional algorithm or another algorithm to calculate the solution (root) to the error locator polynomial, which is thus not repeatedly described here.

In the embodiment illustrated in FIG. 4, the error locator polynomial circuit 120 includes an arithmetic circuit 400. By using part or all of the syndromes S, the arithmetic circuit 400 performs a finite field arithmetic operation to generate the first-degree term coefficient $b_1$ and the constant term coefficient $b_0$ in the coefficients C of the error locator polynomial for the decoding circuit 130. Specifically, the arithmetic circuit 400 includes an arithmetic circuit 410, an arithmetic circuit 420, and an arithmetic circuit 430. By using part or all of the syndromes S, the arithmetic circuit 410 performs a first finite field arithmetic operation to generate an internal value d. The arithmetic circuit 420 is coupled to the arithmetic circuit 410 to receive the internal value d. By using part or all of the syndromes S and by using the internal value d, the arithmetic circuit 420 performs a second finite field arithmetic operation to generate the constant term coefficient $b_0$ in the coefficients C of the error locator polynomial for the decoding circuit 130. The arithmetic circuit 430 is coupled to the arithmetic circuit 410 to receive the internal value d. By using part or all of the syndromes S and by using the internal value d, the arithmetic circuit 430 performs a third finite field arithmetic operation to generate the first-degree term coefficient $b_1$ in the coefficients C of the error locator polynomial for the decoding circuit 130.

In the embodiment illustrated in FIG. 4, the arithmetic circuit 410 includes a LUT circuit 411, a finite field adding circuit 412, a LUT circuit 413, a LUT circuit 414, a finite field adding circuit 415, and a finite field multiplying circuit 416. The LUT circuit 411 receives and uses the syndrome S1 to look up a first lookup table to obtain a finite field cube value 411a of the syndrome S1, i.e., a finite field arithmetic value of $(S1)^3$. The LUT circuit 411 includes a read only memory or another memory for storing the first lookup table. For example, in an applied situation where "the syndrome S1 is a 6-bit value" and "the finite field cube value 411a is a 6-bit value", the LUT circuit 411 includes a storage space of 63*6 bits for storing the lookup table of "converting S1 to $(S1)^3$".

The finite field adding circuit 412 is coupled to the LUT circuit 411 to receive the finite field cube value 411a. The finite field adding circuit 412 performs a finite field adding operation by using the finite field cube value 411a and the syndrome S3 in the syndromes S to generate a finite field adding value 412a, i.e., a finite field arithmetic value of $(S1)^3+S3$. In some embodiments, the 1-stage XOR gate is used to implement the finite field adding circuit 412. The LUT circuit 413 is coupled to the finite field adding circuit 412 to receive the finite field adding value 412a. The LUT circuit 413 uses the finite field adding value 412a to look up a second lookup table to obtain a finite field negative-one power value 413a of the finite field adding value 412a, i.e., a finite field arithmetic value of $[(S1)^3+S3]^{-1}$. The LUT circuit 413 includes a read only memory or another memory for storing the second lookup table. For example, in an applied situation where "the finite field adding value 412a is a 6-bit value" and "the finite field negative-one power value 413a is a 6-bit value", the LUT circuit 413 includes a storage space of 63*6 bits for storing the lookup table of "converting $(S1)^3+S3$ to $[(S1)^3+S3]^{-1}$".

The LUT circuit 414 receives and uses the syndrome S1 to look up a third lookup table to obtain a finite field fifth-power value 414a of the syndrome S1, i.e., a finite field arithmetic value of $(S1)^5$. The LUT circuit 414 includes a read only memory or another memory for storing the third lookup table. For example, in an applied situation where "the syndrome S1 is a 6-bit value" and "the finite field fifth-power value 414a is a 6-bit value", the LUT circuit 414 includes a storage space of 63*6 bits for storing the lookup table of "converting S1 to $(S1)^5$". The finite field adding circuit 415 is coupled to the LUT circuit 414 to receive the finite field fifth-power value 414a. The finite field adding circuit 415 performs a finite field adding operation by using the finite field fifth-power value 414a and the syndrome S5 in the syndromes S to generate a finite field adding value 415a, i.e., a finite field arithmetic value of $(S1)^5+S5$. In some embodiments, the 1-stage XOR gate is used to implement the finite field adding circuit 415.

The finite field multiplying circuit 416 is coupled to the LUT circuit 413 and the finite field adding circuit 415 to respectively receive the finite field negative-one power value 413a and the finite field adding value 415a. The finite field multiplying circuit 416 performs a finite field multiplying operation by using the finite field negative-one power value 413a and the finite field adding value 415a to generate the internal value d, i.e., a finite field arithmetic value of $[(S1)^5+S5]*[(S1)^3+S3]^{-1}$. In some embodiments, the 1-stage AND gate and the 4-stage XOR gate are used to implement the finite field multiplying circuit 416.

In the embodiment illustrated in FIG. 4, the arithmetic circuit 420 includes a finite field multiplying circuit 421 and a finite field adding circuit 422. The finite field multiplying circuit 421 is coupled to the arithmetic circuit 410 to receive the internal value d. The finite field multiplying circuit 421 performs a finite field multiplying operation by using the internal value d and the syndrome S1 to generate a finite field product value 421a, i.e., a finite field arithmetic value of $d*S1$. In some embodiments, the 1-stage AND gate and the 4-stage XOR gate are used to implement the finite field multiplying circuit 421. The finite field adding circuit 422 is coupled to the finite field multiplying circuit 421 to receive the finite field product value 421a. The finite field adding circuit 422 performs a finite field adding operation by using the finite field product value 421a and the syndrome S3 in the syndromes S to generate the constant term coefficient $b_0$ for the decoding circuit 130, wherein the constant term coefficient $b_0$ is a finite field arithmetic value of $d*S1+S3$. In some embodiments, the 1-stage XOR gate is used to implement the finite field adding circuit 422.

In the embodiment illustrated in FIG. 4 the arithmetic circuit 430 includes a finite field squaring circuit 431 and a finite field adding circuit 432. The finite field squaring circuit 431 receives and uses the syndrome S1 to perform a finite field squaring operation to generate a finite field square value 431a of the syndrome S1, i.e., a finite field arithmetic value of $(S1)^2$. In some embodiments, the 1-stage XOR gate is used to implement the finite field squaring circuit 431. The finite field adding circuit 432 is coupled to the finite field squaring circuit 431 and the arithmetic circuit 410 to respectively receive the finite field square value 431a and the internal value d. The finite field adding circuit 432 performs a finite field adding operation by using the finite field square value 431a and the internal value d to generate the first-degree term coefficient $b_1$ for the decoding circuit 130, wherein the first-degree coefficient $b_1$ is a finite field arithmetic value of $(S1)^2+d$.

Figure 5:
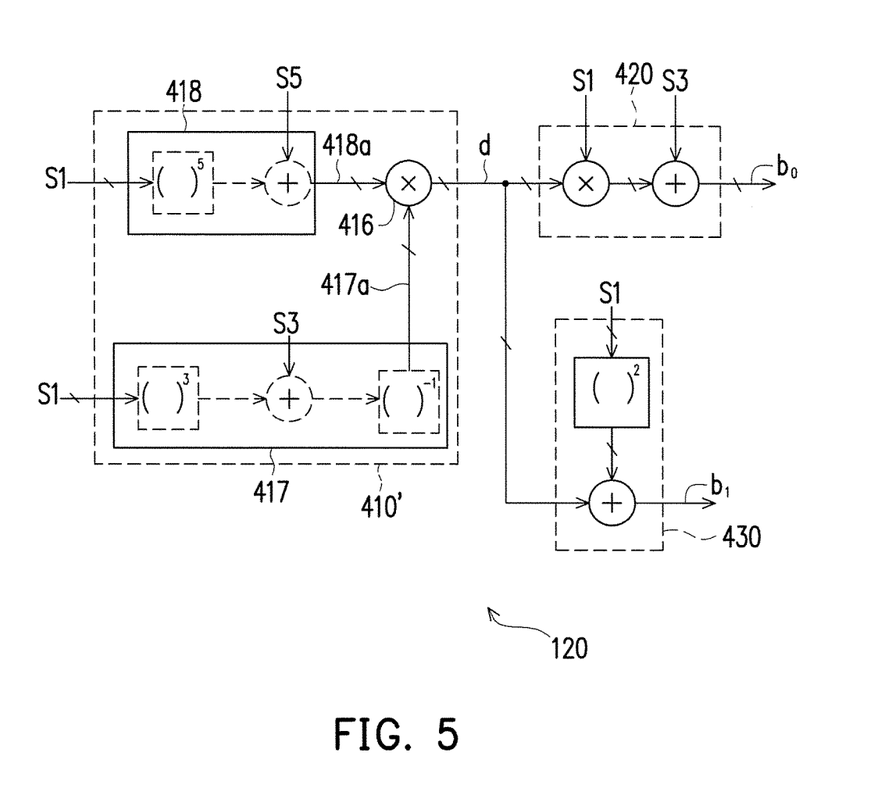
FIG. 5 is a schematic circuit block diagram illustrating the error locator polynomial circuit shown in FIG. 1 according to another embodiment of the invention.

In the embodiment illustrated in FIG. 5, it is supposed that the ECC decoder 100 at most corrects 3 error bits (m=3) in the codeword 12. In the applied situation where m is 3, the syndromes S output by the syndrome generator circuit 110 to the error locator polynomial circuit 120 includes the syndrome S1, the syndrome S3, and the syndrome S5. Bit numbers of the syndrome S1, the syndrome S3, and the syndrome S5 may be determined by the design needs. For example, any one of the syndrome S1, the syndrome S3, and the syndrome S5 may be a 6-bit value. The error locator polynomial circuit 120 performs an arithmetic operation by using the syndrome S1, the syndrome S3, and the syndrome S5 to generate a first-degree term coefficient $b_1$ and a constant term coefficient $b_0$ in an error locator polynomial $X^3 + S1\ X^2 + b_1 X + b_0 = 0$ for the decoding circuit 130.

Reference may be made to the error locator polynomial circuit 120, the arithmetic circuit 410, the arithmetic circuit 420, and the arithmetic circuit 430 illustrated in FIG. 4 for relevant descriptions of the error locator polynomial circuit 120, an arithmetic circuit 410', the arithmetic circuit 420, and the arithmetic circuit 430 illustrated in FIG. 5, which are thus not repeatedly described here.

In the embodiment illustrated in FIG. 5, the arithmetic circuit 410' includes a finite field multiplying circuit 416, a LUT circuit 417, and a LUT circuit 418. The LUT circuit 417 receives and uses the syndrome S1 and the syndrome S3 to look up a first lookup table to obtain a first finite field arithmetic value 417a, i.e., a finite field arithmetic value of $[(S1)^3 + S3]^{-1}$. The LUT circuit 417 includes a read only memory or another memory for storing the first lookup table. For example, in an applied situation where "the syndrome S1 is a 6-bit value" and "the syndrome S3 is a 6-bit value", the LUT circuit 417 includes a storage space of 63*64*6 bits for storing the lookup table of "converting S1 and S3 to $[(S1)^3 + 53]^{-1}$". The LUT circuit 418 receives and uses the syndrome S1 and the syndrome S5 to look up a second lookup table to obtain a second finite field arithmetic value 418a. For example, the LUT circuit 418 look up the second lookup table to obtain a finite field adding value of the syndrome S5 and a finite field fifth-power value of the syndrome S1, i.e., the finite field adding value 418a is a finite field arithmetic value of $(S1)^5 + S5$. The LUT circuit 418 includes a read only memory or another memory for storing the second lookup table. For example, in an applied situation where "the syndrome S1 is a 6-bit value" and "the syndrome S5 is a 6-bit value", the LUT circuit 418 includes a storage space of 63*64*6 bits for storing the lookup table of "converting S1 and S5 to $(S1)^5 + S5$". The finite field multiplying circuit 416 is coupled to the LUT circuit 417 and the LUT circuit 418 to respectively receive the first finite field arithmetic value 417a and the second finite field arithmetic value 418a and perform a finite field multiplying operation by using the first finite field arithmetic value 417a and the second finite field arithmetic value 418a to generate the internal value d for the arithmetic circuit 420 and the arithmetic circuit 430.

It shall be noted that in different applied situations, relevant functions of the syndrome generator circuit 110, the error locator polynomial circuit 120, and/or the decoding circuit 130 may be implemented as software, firmware, or hardware by utilizing common programming languages (e.g., C), hardware description languages (e.g., Verilog HDL), or other adequate programming languages. The programming languages capable of executing the relevant functions can be arranged into any known computer-accessible media such as magnetic tapes, semiconductor memories, magnetic disks, or compact disks (e.g., CD-ROM); or the programming languages may be transmitted via the Internet, a wired communication, a wireless communication, or other communication media. The programming languages may be stored in the computer-accessible media, so that a computer processor can access/execute programming codes of the programming languages. In addition, the apparatus and the method of the invention can also be implemented by a combination of hardware and software.

In summary of the above, the ECC decoder 100 described in the embodiments of the invention is capable of performing the BCH decoding. In the process of the BCH decoding, the LUT circuit is used to implement one or more operators of the error locator polynomial circuit 120 to enhance a speed of the BCH decoding and lower power consumption of the error locator polynomial circuit 120.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. An error checking and correcting decoder for performing a Bose-Chaudhuri-Hocquenghem decoding method to decode codeword into decoded data, the error checking and correcting decoder comprising:
   a syndrome generator circuit for receiving the codeword and generating a plurality of syndromes corresponding to the codeword;
   an error locator polynomial circuit, comprising at least one input end coupled to at least one output end of the syndrome generator circuit to receive the syndromes, for performing an arithmetic operation by using the syndromes to generate a plurality of coefficients of an error locator polynomial, wherein the arithmetic operation comprises a plurality of operators, and the error locator polynomial circuit comprise:
      a lookup table circuit, comprising a memory configured to store a lookup table and being at least one operator in the operators to receive and use at least one of the syndromes to look up the lookup table to obtain a finite field arithmetic value of the syndrome; and
   a decoding circuit, coupled to at least one output end of the error locator polynomial circuit to receive the coefficients, for correcting the codeword to generate the decoded data according to at least one solution to the error locator polynomial with the coefficients.

2. The error checking and correcting decoder according to claim 1, wherein the error locator polynomial circuit comprises:
   a first arithmetic circuit performing a first finite field arithmetic operation by using part or all of the syndromes to generate a first-degree term value; and
   a second arithmetic circuit coupled to the first arithmetic circuit to receive the first-degree term value, wherein the second arithmetic circuit performs a second finite field arithmetic operation by using part or all of the syndromes and by using the first-degree term value to generate a constant term value,
   wherein in a first mode, the first-degree term value is used as a first-degree term coefficient in the coefficients of the error locator polynomial, and the constant term value is used as a constant term coefficient in the coefficients of the error locator polynomial.

3. The error checking and correcting decoder according to claim 2, wherein in a second mode, 1 is used as the first-degree term coefficient, and a first syndrome in the syndromes is used as the constant term coefficient.

4. The error checking and correcting decoder according to claim 2, wherein the first arithmetic circuit comprises:
   a finite field squaring circuit receiving and using a first syndrome in the syndromes to perform a finite field squaring operation to generate a finite field square value of the first syndrome;

a finite field multiplying circuit, coupled to the finite field squaring circuit to receive the finite field square value, and performing a finite field multiplying operation by using the finite field square value and a second syndrome in the syndromes to generate a finite field product value; and a finite field adding circuit, coupled to the finite field multiplying circuit to receive the finite field product value, and performing a finite field adding operation by using the finite field product value and a third syndrome in the syndromes to generate the first-degree term value.

5. The error checking and correcting decoder according to claim 2, wherein the lookup table circuit is configured to receive and use a first syndrome in the syndromes to look up the lookup table to obtain a finite field cube value of the first syndrome, and the error locator polynomial circuit further comprises:
a first finite field adding circuit, coupled to the lookup table circuit to receive the finite field cube value, and performing a finite field adding operation by using the finite field cube value and a second syndrome in the syndromes to generate a third-degree term value, wherein the second arithmetic circuit is further coupled to the first finite field adding circuit to receive the third-degree term value, and the second arithmetic circuit performs the second finite field arithmetic operation by using part or all of the syndromes and by using the first-degree term value and the third-degree term value to generate the constant term value, and in the first mode, the third-degree term value is used as a third-degree term coefficient in the coefficients of the error locator polynomial.

6. The error checking and correcting decoder according to claim 5, wherein
the second arithmetic circuit comprises:
a finite field squaring circuit, coupled to the first finite field adding circuit to receive the third-degree term value, for performing a finite field squaring operation to generate a finite field square value of the third-degree term value;

a finite field multiplying circuit, coupled to the first arithmetic circuit to receive the first-degree term value, and performing a finite field multiplying operation by using the first-degree term value and the first syndrome to generate a finite field product value; and a second finite field adding circuit, coupled to the finite field multiplying circuit and the finite field squaring circuit to respectively receive the finite field product value and the finite field square value, and performing the finite field adding operation by using the finite field product value and the finite field square value to generate the constant term value, the error locator polynomial circuit further comprises:
a finite field multiplying circuit, coupled to the first finite field adding circuit to receive the third-degree term value, and performing a finite field multiplying operation by using the third-degree term value and the first syndrome to generate a second-degree term value, wherein in the first mode, the second-degree term value is used as a second-degree term coefficient in the coefficients of the error locator polynomial.

7. The error checking and correcting decoder according to claim 5, wherein the error locator polynomial circuit further comprises:

a first error-flagging circuit receiving the first syndrome and the second syndrome in the syndromes and checking a plurality of bits of the first syndrome and a plurality of bits of the second syndrome to correspondingly generate an error-flagging signal for the decoding circuit.

8. The error checking and correcting decoder according to claim 7, wherein the error locator polynomial circuit further comprises:

a second error-flagging circuit, coupled to the first error-flagging circuit and the first finite field adding circuit to respectively receive the error-flagging signal and the third-degree term value, and configured to check the error-flagging signal and a plurality of bits of the third-degree term value to correspondingly generate an error bit number flagging signal for the decoding circuit.

9. The error checking and correcting decoder according to claim 7, wherein the error locator polynomial circuit further comprises:

a second error-flagging circuit, coupled to the first error-flagging circuit, the second arithmetic circuit, and the first finite field adding circuit to respectively receive the error-flagging signal, the constant term value, and the third-degree term value, and configured to check the error-flagging signal, a plurality of bits of the constant term value, and a plurality of bits of the third-degree term value to correspondingly generate an error bit number flagging signal for the decoding circuit.

10. The error checking and correcting decoder according to claim 2, wherein the first arithmetic circuit comprises:

the lookup table circuit receiving and using a first syndrome and a second syndrome in the syndromes to look up the lookup table to obtain a finite field product value of the second syndrome and a finite field square value of the first syndrome; and a finite field adding circuit, coupled to the lookup table circuit to receive the finite field product value, and performing a finite field adding operation by using the finite field product value and a third syndrome in the syndromes to generate the first-degree term value.

11. The error checking and correcting decoder according to claim 2, wherein
the lookup table circuit is configured to receive and use a first syndrome and a second syndrome in the syndromes to look up the lookup table to obtain a finite field adding value of the second syndrome and a finite field cube value of the first syndrome, and using the finite field adding value as a third-degree term value, wherein the second arithmetic circuit is further coupled to the lookup table circuit to receive the third-degree term value, and the second arithmetic circuit performs the second finite field arithmetic operation by using part or all of the syndromes and by using the first-degree term value and the third-degree term value to generate the constant term value, and in the first mode, the third-degree term value is used as a third-degree term coefficient in the coefficients of the error locator polynomial.

12. The error checking and correcting decoder according to claim 11, wherein the error locator polynomial circuit further comprises:

a finite field multiplying circuit, coupled to the lookup table circuit to receive the third-degree term value, and performing a finite field multiplying operation by using the third-degree term value and the first syndrome to generate a second-degree term value, wherein in the first mode, the second-degree term value is used as a second-degree term coefficient in the coefficients of the error locator polynomial.

13. The error checking and correcting decoder according to claim 11, wherein the error locator polynomial circuit further comprises:
a first error-flagging circuit, receiving the first syndrome and the second syndrome in the syndromes, and checking a plurality of bits of the first syndrome and a plurality of bits of the second syndrome to correspondingly generate an error-flagging signal for the decoding circuit; and
a second error-flagging circuit, coupled to the first error-flagging circuit and the lookup table circuit to respectively receive the error-flagging signal and the third-degree term value, and configured to check the error-flagging signal and a plurality of bits of the third-degree term value to correspondingly generate an error bit number flagging signal for the decoding circuit.

14. The error checking and correcting decoder according to claim 11, wherein the error locator polynomial circuit further comprises:
a first error-flagging circuit, receiving the first syndrome and the second syndrome in the syndromes, and checking a plurality of bits of the first syndrome and a plurality of bits of the second syndrome to correspondingly generate an error-flagging signal for the decoding circuit; and
a second error-flagging circuit, coupled to the first error-flagging circuit, the second arithmetic circuit, and the lookup table circuit to respectively receive the error-flagging signal, the constant term value, and the third-degree term value, and configured to check the error-flagging signal, a plurality of bits of the constant term value, and a plurality of bits of the third-degree term value to correspondingly generate an error bit number flagging signal for the decoding circuit.

15. The error checking and correcting decoder according to claim 1, wherein a third-degree term coefficient in the error locator polynomial is 1, a second-degree term coefficient in the error locator polynomial is a first syndrome in the syndromes, and the error locator polynomial circuit comprises:
an arithmetic circuit performing a finite field arithmetic operation by using part or all of the syndromes to generate a first-degree term coefficient and a constant term coefficient in the coefficients of the error locator polynomial.

16. The error checking and correcting decoder according to claim 15, wherein the arithmetic circuit comprises:
a first arithmetic circuit performing a first finite field arithmetic operation by using part or all of the syndromes to generate an internal value;
a second arithmetic circuit, coupled to the first arithmetic circuit to receive the internal value, and configured to perform a second finite field arithmetic operation by using part or all of the syndromes and the internal value to generate the constant term coefficient; and
a third arithmetic circuit, coupled to the first arithmetic circuit to receive the internal value, and configured to perform a third finite field arithmetic operation by using part or all of the syndromes and the internal value to generate the first-degree term coefficient.

17. The error checking and correcting decoder according to claim 16, wherein the first arithmetic circuit comprises:
a first lookup table circuit receiving and using the first syndrome to look up a first lookup table to obtain a finite field cube value of the first syndrome;
a first finite field adding circuit, coupled to the first lookup table circuit to receive the finite field cube value, and performing a finite field adding operation by using the finite field cube value and a second syndrome in the syndromes to generate a first finite field adding value;
a second lookup table circuit, coupled to the first finite field adding circuit to receive the first finite field adding value, and using the first finite field adding value to look up a second lookup table to obtain a finite field negative-one power value of the first finite field adding value;
a third lookup table circuit receiving and using the first syndrome to look up a third lookup table to obtain a finite field fifth-power value of the first syndrome;
a second finite field adding circuit, coupled to the third lookup table circuit to receive the finite field fifth-power value, and performing the finite field adding operation by using the finite field fifth-power value and a third syndrome in the syndromes to generate a second finite field adding value; and
a finite field multiplying circuit, coupled to the second lookup table circuit and the second finite field adding circuit to respectively receive the finite field negative-one power value and the second finite field adding value, and performing a finite field multiplying operation by using the finite field negative-one power value and the second finite field adding value to generate the internal value.

18. The error checking and correcting decoder according to claim 16, wherein the first arithmetic circuit comprises:
a first lookup table circuit receiving and using the first syndrome and a second syndrome to look up a first lookup table to obtain a first finite field arithmetic value;
a second lookup table circuit receiving and using the first syndrome and a third syndrome to look up a second lookup table to obtain a second finite field arithmetic value; and
a finite field multiplying circuit, coupled to the first lookup table circuit and the second lookup table circuit to respectively receive the first finite field arithmetic value and the second finite field arithmetic value, and performing a finite field multiplying operation by using the first finite field arithmetic value and the second finite field arithmetic value to generate the internal value.

19. The error checking and correcting decoder according to claim 16, wherein the second arithmetic circuit comprises:
a finite field multiplying circuit, coupled to the first arithmetic circuit to receive the internal value, and performing a finite field multiplying operation by using the internal value and the first syndrome to generate a finite field product value; and
a finite field adding circuit, coupled to the finite field multiplying circuit to receive the finite field product value, and performing a finite field adding operation by using the finite field product value and a second syndrome in the syndromes to generate the constant term coefficient.

20. The error checking and correcting decoder according to claim 16, wherein the third arithmetic circuit comprises:
a finite field squaring circuit receiving and using the first syndrome to perform a finite field squaring operation to generate a finite field square value of the first syndrome; and a finite field adding circuit, coupled to the finite field squaring circuit and the first arithmetic circuit to respectively receive the finite field square value and the internal value, and performing a finite field adding operation by using the finite field square value and the internal value to generate the first-degree term coefficient.

* * * * *